(12) United States Patent
Takarada et al.

(10) Patent No.: US 10,514,599 B2
(45) Date of Patent: Dec. 24, 2019

(54) IMPRINT APPARATUS AND METHOD OF MANUFACTURING ARTICLE

(71) Applicant: CANON KABUSHIKI KAISHA, Tokyo (JP)

(72) Inventors: Yosuke Takarada, Utsunomiya (JP); Sentaro Aihara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 696 days.

(21) Appl. No.: 14/824,325

(22) Filed: Aug. 12, 2015

(65) Prior Publication Data
US 2016/0046065 A1 Feb. 18, 2016

(30) Foreign Application Priority Data

Aug. 14, 2014 (JP) .................... 2014-165198

(51) Int. Cl.
*G03F 7/00* (2006.01)
(52) U.S. Cl.
CPC .................. *G03F 7/0002* (2013.01)
(58) Field of Classification Search
None
See application file for complete search history.

(56) References Cited

U.S. PATENT DOCUMENTS

| | | | |
|---|---|---|---|
| 6,871,558 B2 | 3/2005 | Choi et al. | |
| 7,157,036 B2 | 1/2007 | Choi et al. | |
| 7,914,717 B2 | 3/2011 | Yamada et al. | |
| 8,309,008 B2 * | 11/2012 | Choi .................. | B82Y 10/00 264/319 |
| 8,652,393 B2 | 2/2014 | Khusnatdinov et al. | |
| 8,734,701 B2 | 5/2014 | Kawakami | |
| 8,945,444 B2 | 2/2015 | Lu et al. | |
| 8,951,031 B2 | 2/2015 | Kasumi | |

(Continued)

FOREIGN PATENT DOCUMENTS

| JP | 2005026462 A | 1/2005 |
|---|---|---|
| JP | 2005062035 A | 3/2005 |

(Continued)

OTHER PUBLICATIONS

Office Action issued in Japanese Appln. No. 2014-165198 dated Jun. 1, 2018.

(Continued)

*Primary Examiner* — Alison L Hindenlang
*Assistant Examiner* — George W. Brady
(74) *Attorney, Agent, or Firm* — Rossi, Kimms & McDowell LLP (57) ABSTRACT

The present invention provides an imprint apparatus which forms a relief pattern in an imprint material on a substrate using a mold, the apparatus including a curing unit configured to cure the imprint material, a moving unit configured to relatively move the mold and the substrate, a detection unit configured to detect a pattern of light reflected by the mold and light reflected by the substrate, and a processing unit configured to obtain information on a separation state of the mold and the cured imprint material on the substrate based on the pattern detected by the detection unit while separating the mold from the imprint material by widening, using the moving unit, an interval between the mold and the substrate.

11 Claims, 8 Drawing Sheets

(56) References Cited

U.S. PATENT DOCUMENTS

| | | | |
|---|---|---|---|
| 9,573,319 B2 | 2/2017 | Okushima et al. | |
| 2003/0166814 A1* | 9/2003 | Sparrowe | B29C 43/003 526/319 |
| 2009/0140445 A1* | 6/2009 | Lu | B29C 43/003 264/40.1 |
| 2013/0056905 A1* | 3/2013 | Hamaya | G03F 7/0002 264/293 |
| 2013/0181365 A1* | 7/2013 | Shinoda | B29C 59/02 264/40.1 |
| 2013/0241096 A1 | 9/2013 | Shudo et al. | |
| 2015/0076724 A1* | 3/2015 | Sato | G03F 7/0002 264/40.1 |
| 2015/0325526 A1 | 11/2015 | Hayashi | |

FOREIGN PATENT DOCUMENTS

| | | | |
|---|---|---|---|
| JP | 2006514428 A | | 4/2006 |
| JP | 2006528088 A | | 12/2006 |
| JP | 2011003616 A | | 1/2011 |
| JP | 2011512019 A | | 4/2011 |
| JP | 2011100952 A | | 5/2011 |
| JP | 2011205039 A | | 10/2011 |
| JP | 2012507141 A | | 3/2012 |
| JP | 2013219331 A | | 10/2013 |
| JP | 2013225661 A | | 10/2013 |
| JP | 2014033050 A | * | 2/2014 |
| JP | 2014033050 A | | 2/2014 |
| JP | 5669377 B2 | | 2/2015 |
| KR | 1020100024898 A | | 3/2010 |
| KR | 101238137 B1 | | 2/2013 |
| WO | 2005000552 A2 | | 1/2005 |
| WO | 2008129962 A1 | | 10/2008 |

OTHER PUBLICATIONS

Office Action issued in Korean Appln. No. 10-2015-0114433 dated Feb. 5, 2018.

Office Action issued in Chinese Appln. No. 201510490307.9 dated Mar. 27, 2019. English translation provided.

* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

Recently, an imprint technique capable of forming a fine pattern has received attention as a technique of manufacturing articles such as various devices (for example, semiconductor devices such as ICs and LSIs, liquid crystal devices, image capturing devices such as CCDs, and magnetic heads). In a state in which a resin on a substrate such as a silicon wafer or a glass plate and a mold (die) on which the fine pattern has been formed are in contact with each other, the imprint technique cures the resin and transfers the fine pattern onto the substrate.

The imprint technique includes several resin curing methods and a photo-curing method is known as one of the resin curing methods. In the photo-curing method, ultraviolet irradiation is performed in a state in which a transparent mold is in contact with an ultraviolet-curing resin, and then the mold is separated after the resin is exposed to the light and cured. The imprint technique by the photo-curing method is suitable for manufacturing the devices because it can, for example, observe an alignment mark on the substrate via the transparent mold.

Release of separating the mold from the cured resin on the substrate may pose a problem in an imprint apparatus using such an imprint technique. If the release is not performed properly, the cured resin on the substrate may be torn, the resin may remain in the pattern (concave portion) of the mold to cause clogging, and the mold or the substrate may be shifted (or deformed) from a predetermined position. These result in decreasing the yield of the articles and the operating ratio of the imprint apparatus.

Therefore, performing the release properly leads to increases in the yield of the articles and the operating ratio of the imprint apparatus. Techniques for this purpose have been proposed in Japanese Patent Laid-Open No. 2006-528088 and Japanese Patent Laid-Open No. 2011-205039. Japanese Patent Laid-Open No. 2006-528088 has disclosed a technique of reducing adhesion between a mold and a resin by applying a surfactant (release agent) to the pattern surface of the mold outside the imprint apparatus. Japanese Patent Laid-Open No. 2011-205039 has disclosed a technique of reducing adhesion between a mold and a resin by providing, in the imprint apparatus, a measurement unit which measures a force required for the release and applying a release agent to a substrate if the force exceeds a threshold.

In each conventional technique, the occurrence rate of a defect in a pattern formed on the substrate can be decreased. However, it is difficult to grasp a separation state between the mold and the resin, and the yield of the articles and the operating ratio of the imprint apparatus may be affected under abnormal release conditions. In particular, since abnormal release is caused by various factors, the separation state between the mold and the substrate needs to be grasped (evaluated) in order to specify those factors. On the other hand, the separation state between the mold and the substrate can be estimated by measuring the force required for release. However, its precision is low, and also difficult work is required to set a threshold.

SUMMARY OF THE INVENTION

The present invention provides an imprint apparatus advantageous in evaluating a separation state between a mold and a cured imprint material on a substrate while separating the mold from the imprint material.

According to one aspect of the present invention, there is provided an imprint apparatus which forms a relief pattern in an imprint material on a substrate using a mold, the apparatus including a curing unit configured to cure the imprint material, a moving unit configured to relatively move the mold and the substrate, a detection unit configured to detect a pattern of light reflected by the mold and light reflected by the substrate, and a processing unit configured to obtain information on a separation state of the mold and the cured imprint material on the substrate based on the pattern detected by the detection unit while separating the mold from the imprint material by widening, using the moving unit, an interval between the mold and the substrate.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

First Embodiment

Figure 1:
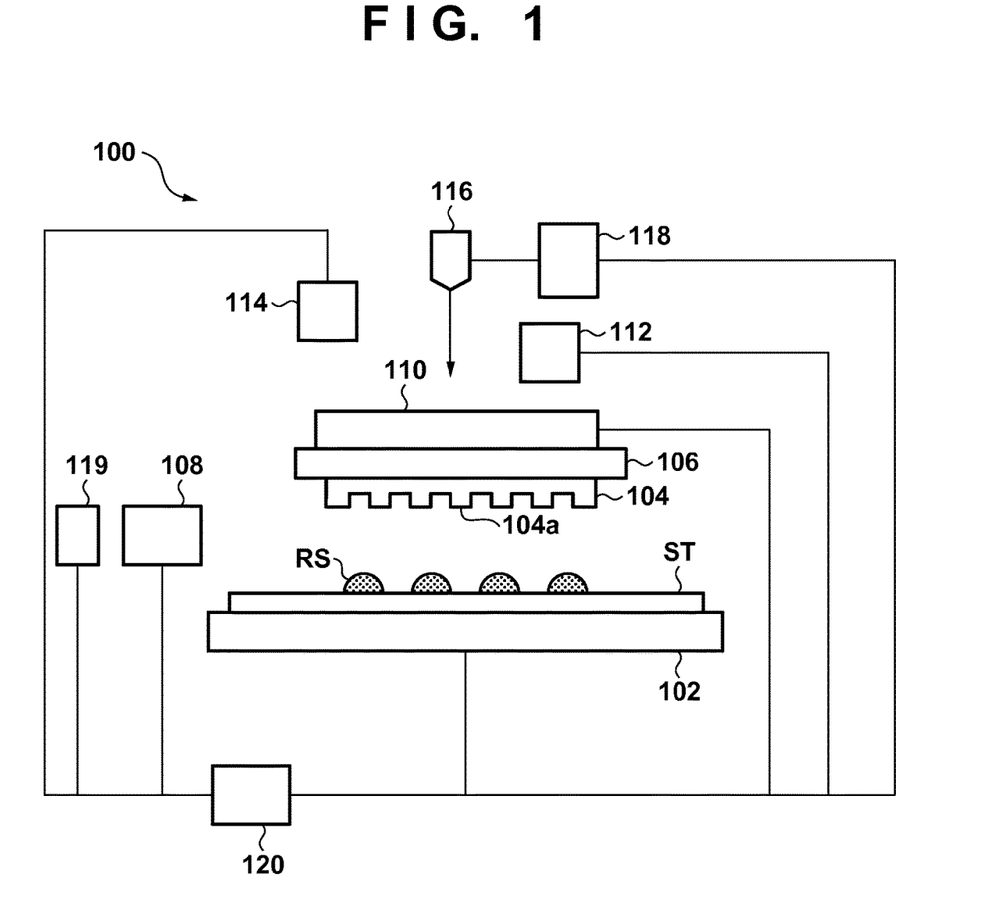
FIG. 1 is a schematic view showing the arrangement of an imprint apparatus according to an aspect of the present invention.
Figure 2:
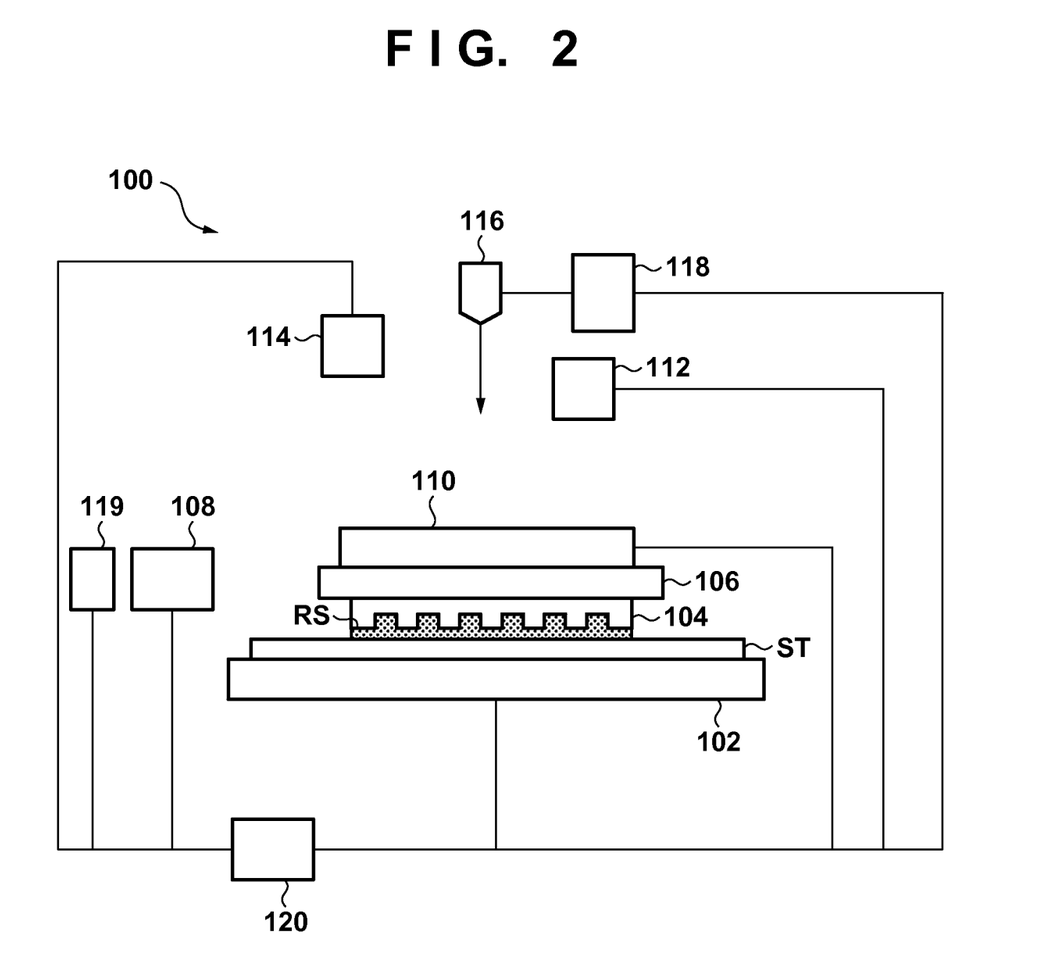
FIG. 2 is a schematic view showing the arrangement of the imprint apparatus according to an aspect of the present invention.
Figure 3:
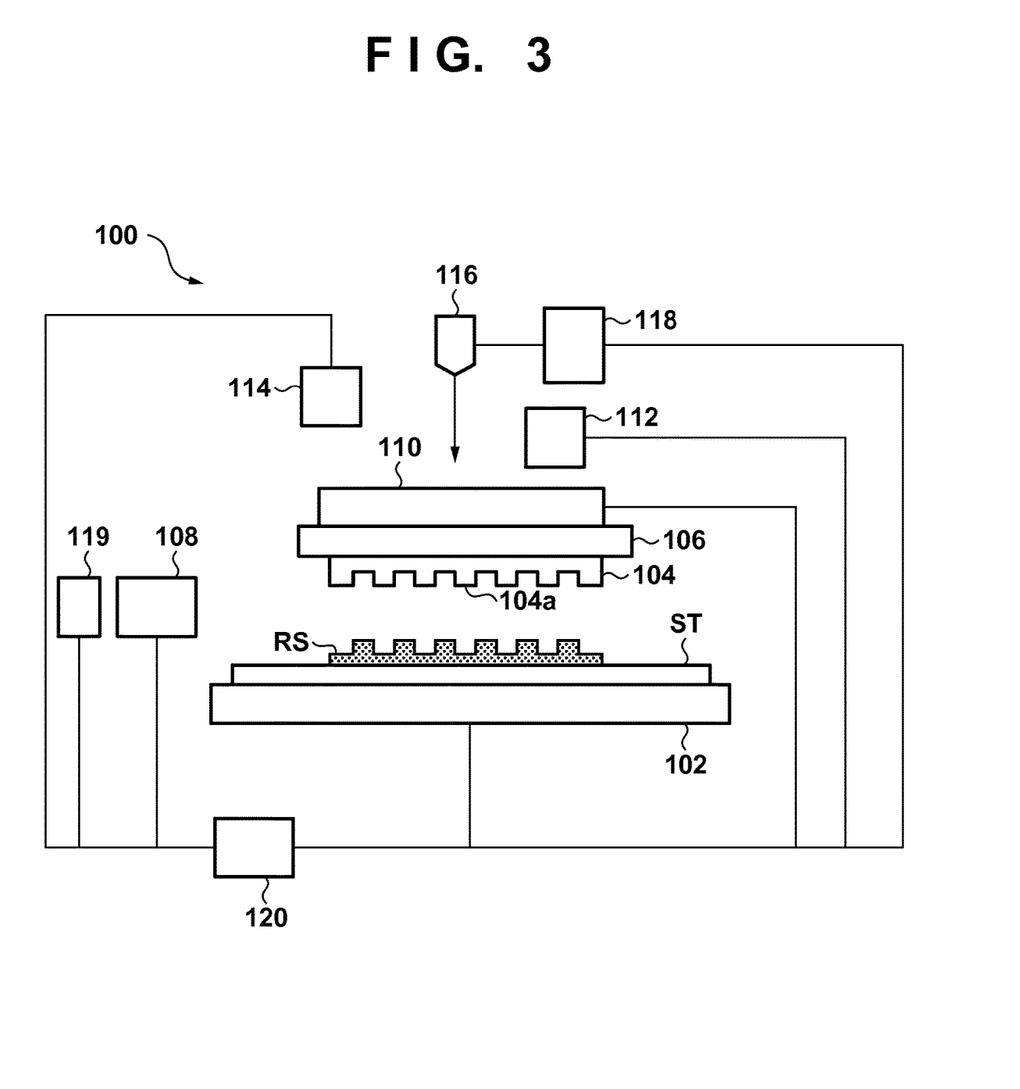
FIG. 3 is a schematic view showing the arrangement of the imprint apparatus according to an aspect of the present invention.

FIGS. 1, 2, and 3 are schematic views each showing the arrangement of an imprint apparatus 100 according to an aspect of the present invention. The imprint apparatus 100 is a lithography apparatus which performs an imprint process of molding an imprint material on a substrate using a mold and forming a pattern (relief pattern) on the substrate. The imprint apparatus 100 adopts a resin as the imprint material and adopts, as a resin curing method, a photo-curing method of curing the resin by ultraviolet irradiation.

The imprint apparatus 100 includes a substrate stage 102, a mold stage 106, a resin supply unit 108, a moving unit 110, a light source 112, a scope 114, a detection unit 116, a processing unit 118, a coating unit 119, and a control unit 120.

The substrate stage 102 moves, via a substrate chuck, while holding a substrate ST such as a silicon wafer or a glass plate. The substrate stage 102 positions the substrate ST to a predetermined position. The substrate stage 102 moves by, for example, driving an actuator such as a linear motor.

A mold 104 is formed by a material such as quartz that transmits ultraviolet rays from the light source 112. The mold 104 has a pattern surface 104a where a pattern (three-dimensional pattern) that should be transferred to the substrate ST has been formed. The mold 104 is held by the mold stage 106 via a mold chuck.

The resin supply unit 108 includes a plurality of dispensers which discharge a resin RS as droplets, and supplies (applies) the resin RS onto the substrate (shot region where the pattern should be formed). More specifically, the resin RS can be applied onto the substrate by moving (scan moving or step moving) the substrate stage 102 while discharging the resin RS from the dispensers that form the resin supply unit 108.

The moving unit 110 includes the actuator formed by an air cylinder or the linear motor and moves the mold stage 106 which holds the mold 104, that is, the mold 104. As shown in FIG. 2, the moving unit 110 brings the mold 104 and the resin RS on the substrate into contact with each other by moving the mold 104 downward (that is, narrowing the interval between the mold 104 and the substrate ST). Further, as shown in FIG. 3, the moving unit 110 separates (releases) the mold 104 from the cured resin RS on the substrate by moving the mold 104 upward (that is, widening the interval between the mold 104 and the substrate ST). As described above, the moving unit 110 has a function of relatively moving the mold 104 and the substrate ST. Note that the mold 104 and the substrate ST may be moved relatively by moving the substrate stage 102 which holds the substrate ST, that is, the substrate ST vertically, or moving both the mold 104 and the substrate ST vertically.

In a state in which the mold 104 and the resin RS on the substrate are in contact with each other, the light source 112 irradiates the resin RS with the ultraviolet rays and cures the resin RS via the mold 104. In other words, the light source 112 functions as a curing unit which cures the resin RS on the substrate.

The scope 114 detects an alignment mark provided on the substrate ST and an alignment mark provided on the mold 104. The scope 114 can also detect a reference mark or the like provided on the substrate stage 102.

The detection unit 116 includes a light source which emits light (illumination light) having a narrow wavelength range, for example, a radiation lamp such as a halogen lamp, a xenon lamp, or a metal halide lamp. The detection unit 116 detects, in order to obtain information on a separation state between the mold 104 and the substrate ST, an interference pattern (interference fringes, that is, so-called Newton rings) between light reflected by the mold 104 and light reflected by the substrate ST.

Let d be a gap between the mold 104 and the substrate ST, and $\lambda$ be the wavelength of illumination light. In this case, light reflected by the mold 104 and light reflected by the substrate ST cancel each other when $2d=m\lambda$ (m is a natural number) is satisfied. As a result, the detection unit 116 detects dark rings. Light reflected by the mold 104 and light reflected by the substrate ST strengthen each other when $2d=(m+\frac{1}{2})\lambda$ is satisfied. As a result, the detection unit 116 detects bright rings. Therefore, the pitches of the interference pattern detected by the detection unit 116 slightly shift and overlap each other for each wavelength when illuminated by broadband white light, resulting in decreasing the contrast of the interference pattern. To prevent this, the detection unit 116 uses, as illumination light, light having the narrow wavelength range.

The processing unit 118 obtains, based on the interference pattern detected by the detection unit 116 while separating the mold 104 from the cured resin RS on the substrate, information on the separation state between the mold 104 and the resin RS.

Gaps are formed between the mold 104 and the substrate ST when the moving unit 110 moves the mold 104 upward in order to separate the mold 104 from the cured resin RS on the substrate. At this time, the detection unit 116 detects the interference pattern corresponding to the gaps between the mold 104 and the substrate ST. It can be considered that the substrate ST can hardly be deformed when separating the mold 104 from the cured resin RS on the substrate. Therefore, the processing unit 118 can obtain, from the interference pattern corresponding to the gaps between the mold 104 and the substrate ST, the shape of the mold 104, that is, the deformation amount of the mold 104 as information on the separation state between the mold 104 and the resin RS.

Figure 4:
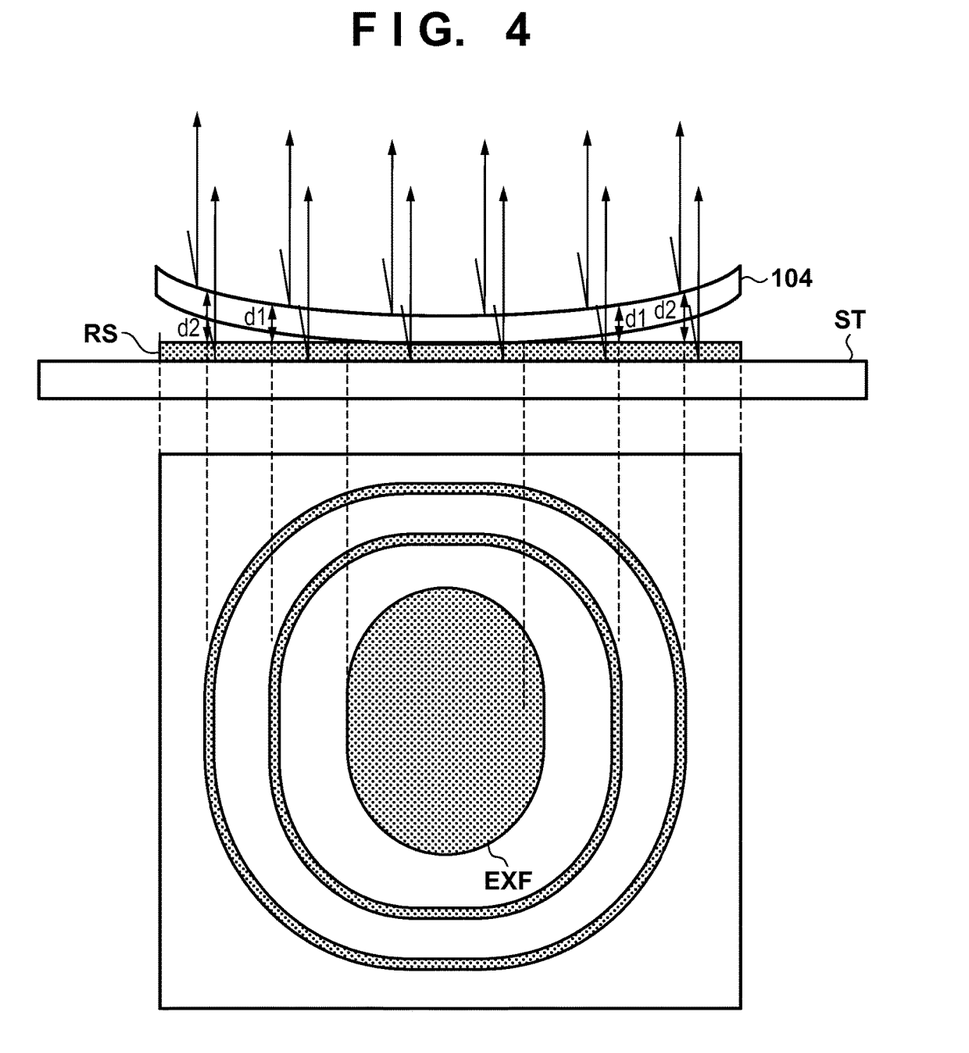
FIG. 4 is a view showing an interference pattern, and gaps between a mold and a substrate.

FIG. 4 is a view showing the gaps between the mold 104 and the substrate ST, and the interference pattern detected by the detection unit 116. Referring to FIG. 4, dark rings are detected in gaps d1 and d2, and the processing unit 118 can obtain the shape of the mold 104, that is, the deformation amount of the mold 104 from the dark rings. The processing unit 118 can also obtain, from the interference pattern shown in FIG. 4, a boundary position EXF between a region where the resin RS and the mold 104 are separated from each other, and a region where the resin RS and the mold 104 are not separated from each other. The boundary position EXF is a position (separation position) where the mold 104 separates from the resin RS, and is one example of information on the separation state between the mold 104 and the resin RS.

The coating unit 119 applies a surfactant (release agent) to the pattern surface 104a of the mold 104 in order to reduce adhesion between the mold 104 and the cured resin RS on the substrate. However, the coating unit 119 is not an essential component of the imprint apparatus 100. For example, the surfactant may be applied to the pattern surface 104a of the mold 104 outside of the imprint apparatus 100.

The control unit 120 includes a CPU and a memory, and controls the respective units of the imprint apparatus 100 to operate the imprint apparatus 100. For example, the control unit 120 causes the respective units of the imprint apparatus 100 to perform an imprint process of molding the resin RS on the substrate using the mold 104 and forming the pattern on the substrate. The control unit 120 evaluates, based on information on the separation state between the mold 104 and the resin RS obtained by the processing unit 118, whether the mold 104 is normally separated from the cured resin RS on the substrate. The control unit 120 stops the imprint process for the next shot region on the substrate ST if it evaluates that the mold 104 is not normally separated from the cured resin RS on the substrate, that is, if release has a problem.

The relationship between the interference pattern detected by the detection unit 116, and information on the separation state between the mold 104 and the resin RS obtained by the processing unit 118 will now be described. In the imprint process, first, the moving unit 110 moves the mold 104 downward, thereby bringing the mold 104 and the resin RS on the substrate into contact with each other. Next, in the state in which the mold 104 and the resin RS on the substrate are in contact with each other, the resin RS is irradiated with the ultraviolet rays from the light source 112 and cured. Then, the moving unit 110 moves the mold 104 upward (that is, forms the gaps between the mold 104 and the substrate ST), thereby separating the mold 104 from the cured resin RS on the substrate.

FIGS. 5A to 5D are views showing changes in the interference pattern while separating the mold 104 from the cured resin RS on the substrate. Each of FIGS. 5A to 5D shows the section of the mold 104, the substrate ST, and the resin RS from side surfaces in two directions perpendicular to each other, and the interference pattern detected by the detection unit 116 corresponding to the progress of separation at that time.

Figure 5A:
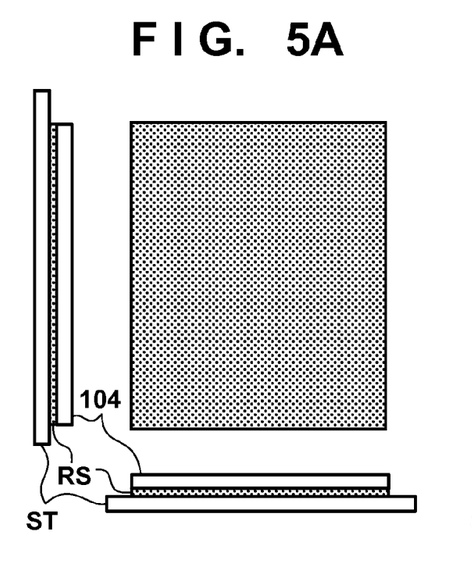
FIGS. 5A to 5D are views showing changes in the interference pattern while separating the mold from a cured resin on the substrate.

FIG. 5A shows a state in which the resin RS on the substrate is cured in the state in which the mold 104 and the resin RS are in contact with each other. At this time, the entire surface of the pattern surface 104a of the mold 104 is in tight contact with the resin RS, no gap is formed between the mold 104 and the resin RS, and thus no interference pattern is detected.

Figure 5B:
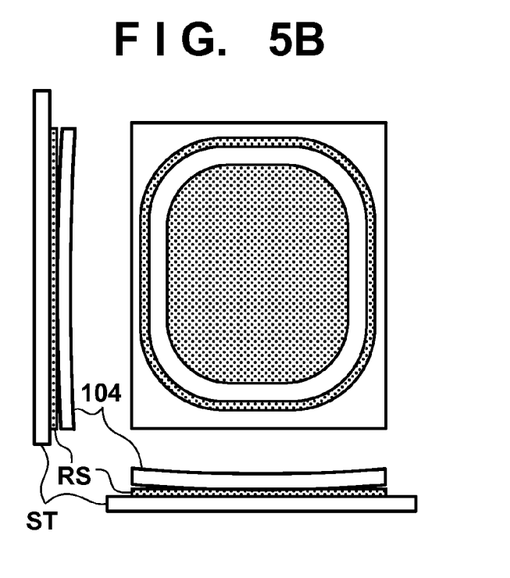
Figure 5C:
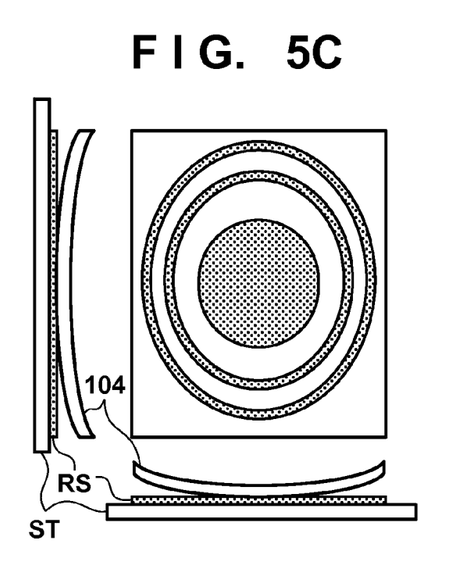
Figure 5D:
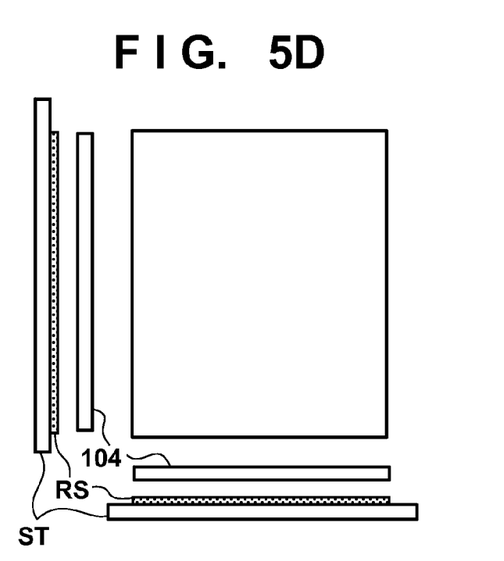

Next, when the mold 104 is moved upward, as shown in FIG. 5B, a state in which a part of the peripheral portion of the pattern surface 104a of the mold 104 separates from the resin RS is obtained. As a result, the interference pattern is detected in a portion where the mold 104 separates from the resin RS. Further, when the mold 104 is moved upward, as shown in FIG. 5C, the pattern surface 104a of the mold 104 further separates from the resin RS and the interference pattern corresponding to the shape (deformation) of the mold 104 is detected. The interference pattern includes one or more interference fringes and is detected in an ellipse shape from the central portion of the pattern surface 104a of the mold 104. Then, if the entire surface of the pattern surface 104a of the mold 104 is separated from the resin RS, as shown in FIG. 5D, no interference pattern is detected.

As described above, in a process of separating the mold 104 from the cured resin RS on the substrate, information on the separation state between the mold 104 and the resin RS can be obtained by analyzing the interference pattern detected by the detection unit 116. More specifically, the present inventors have found that when the interference fringes are detected symmetrically from the center of the shot region on the substrate ST, to be more specific, from the barycentric position of the shot region, clogging of the pattern of the mold 104 does not occur and the pattern of the resin RS is formed on the substrate without being damaged.

Figure 6A:
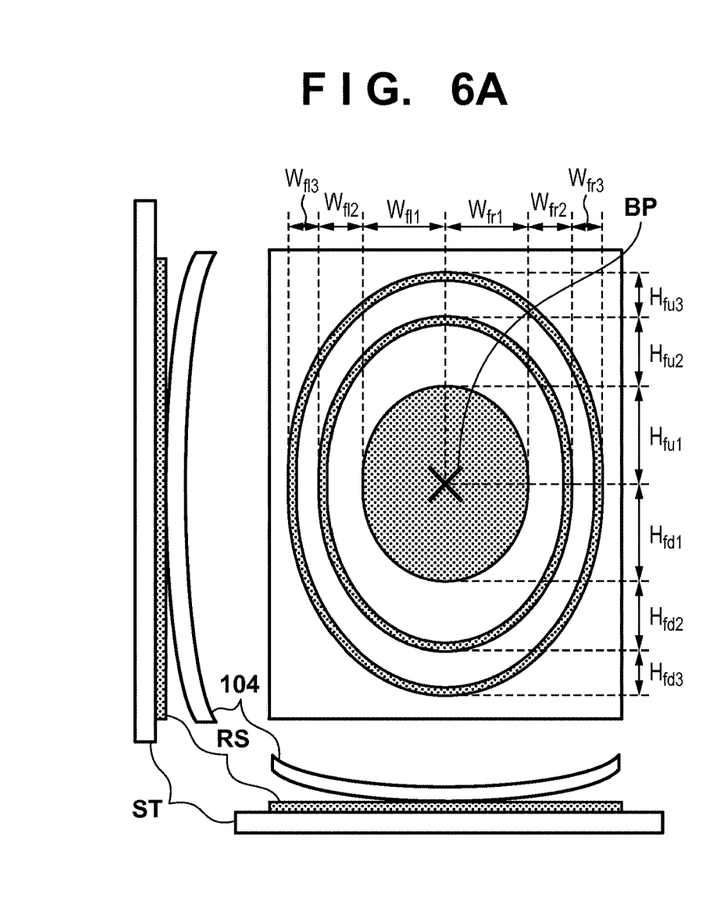
FIGS. 6A and 6B are views showing the interference pattern when separating the mold from the resin on a shot region of the substrate.
Figure 6B:
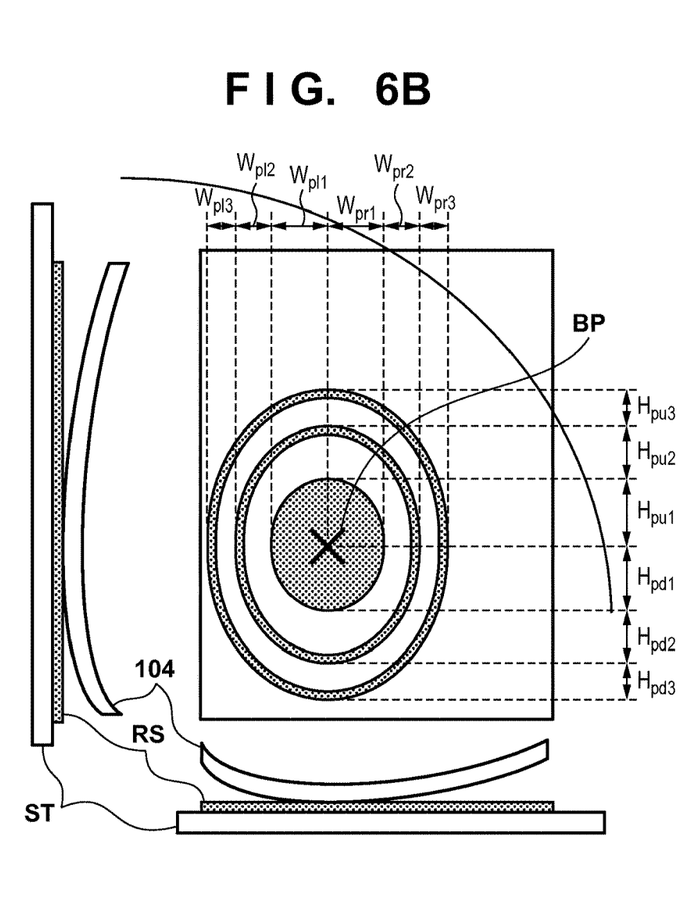

Each of FIGS. 6A and 6B is a view showing the interference pattern when separating the mold 104 from the resin RS in a shot region FF inside of the substrate ST and a shot region PF of the outer peripheral portion of the substrate ST. Each of FIGS. 6A and 6B shows the section of the mold 104, the substrate ST, and the resin RS from the side surfaces in the two directions perpendicular to each other, and the interference pattern detected by the detection unit 116 corresponding to that time.

Referring to FIGS. 6A and 6B, in both the shot regions FF and PF, when the interference fringes are detected symmetrically from each of their barycentric positions BP, it can be evaluated that the mold 104 is normally separated from the resin RS. Assume that a distance from the barycentric position BP of each shot region serving as the reference position of the substrate ST to each interference fringe included in the interference pattern is information on the separation state between the mold 104 and the resin RS.

More specifically, the upper, lower, left, and right end points of each interference fringe are detected, thereby obtaining the distance differences in the lateral direction between the left and right end points of each interference fringe from the barycentric position BP of each shot region, and the distance differences in the longitudinal direction between the upper and lower end points of each interference fringe from the barycentric position BP of each shot region.

Distance differences $W_{sf1}$, $W_{sf2}$ and $W_{sf3}$ in the lateral direction between the left and right end points of each interference fringe from the barycentric position BP of the shot region FF are given by:

$$W_{sf1}=|W_{fl1}-W_{fr1}|$$

$$W_{sf2}=|(W_{fl1}+W_{fl2})-(W_{fr1}+W_{fr2})|$$

$$W_{sf3}=|(W_{fl1}+W_{fl2}+W_{fl3})-(W_{fr1}+W_{fr2}+W_{fr3})|$$

Distance differences $H_{sf1}$, $H_{sf2}$, and $H_{sf3}$ in the longitudinal direction between the upper and lower end points of each interference fringe from the barycentric position BP of the shot region FF are given by:

$$H_{sf1}=|H_{fu1}-H_{fd1}|$$

$$H_{sf2}=|(H_{fu1}+H_{fu2})-(H_{fd1}+H_{fd2})|$$

$$H_{sf3}=|(H_{fu1}+H_{fu2}+H_{fu3})-(H_{fd1}+H_{fd2}+H_{fd3})|$$

Similarly, distance differences $W_{sp1}$, $W_{sp2}$, and $W_{sp3}$ in the lateral direction between the left and right end points of each interference fringe from the barycentric position BP of the shot region PF are given by:

$$W_{sp1}=|W_{pl1}-W_{pr1}|$$

$$W_{sp2}=|(W_{pl1}+W_{pl2})-(W_{pr1}+W_{pr2})|$$

$$W_{sp3}=|(W_{pl1}+W_{pl2}+W_{pl3})-(W_{pr1}+W_{pr2}+W_{pr3})|$$

Distance differences $H_{sp1}$, $H_{sp2}$, and $H_{sp3}$ in the longitudinal direction between the upper and lower end points of each interference fringe from the barycentric position BP of the shot region PF are given by:

$$H_{sp1}=|H_{pu1}-H_{pd1}|$$

$$H_{sp2}=|(H_{pu1}+H_{pu2})-(H_{pd1}+H_{pd2})|$$

$$H_{sp3}=|(H_{pu1}+H_{pu2}+H_{pu3})-(H_{pd1}+H_{pd2}+H_{pd3})|$$

In each of FIGS. 6A and 6B, the interference pattern includes three interference fringes in both the shot regions FF and PF. However, the number of interference fringes is not limited to this. The distance differences in the lateral direction of the left and right end points of each interference fringe, and the distance differences in the longitudinal direction of the upper and lower end points of each interference fringe should be obtained for all the interference fringes included in the interference pattern.

Based on the distance differences obtained as described above, the control unit 120 evaluates whether the interference fringes included in the interference pattern are detected symmetrically from the barycentric position of the shot region, that is, whether the mold 104 is normally separated from the resin RS. For example, a threshold ($THW_n$, $THH_n$) (n=1, 2, . . . ) is set for each distance difference ($W_n$, $H_n$) (n=1, 2, . . . ) between the interference fringes, and it is determined whether each distance difference exceeds the threshold. The control unit 120 determines whether each distance difference between the interference fringes does not exceed the threshold with respect to all the interference patterns that change in accordance with the progress of separation of the mold 104 from the cured resin RS on the substrate.

Figure 7A:
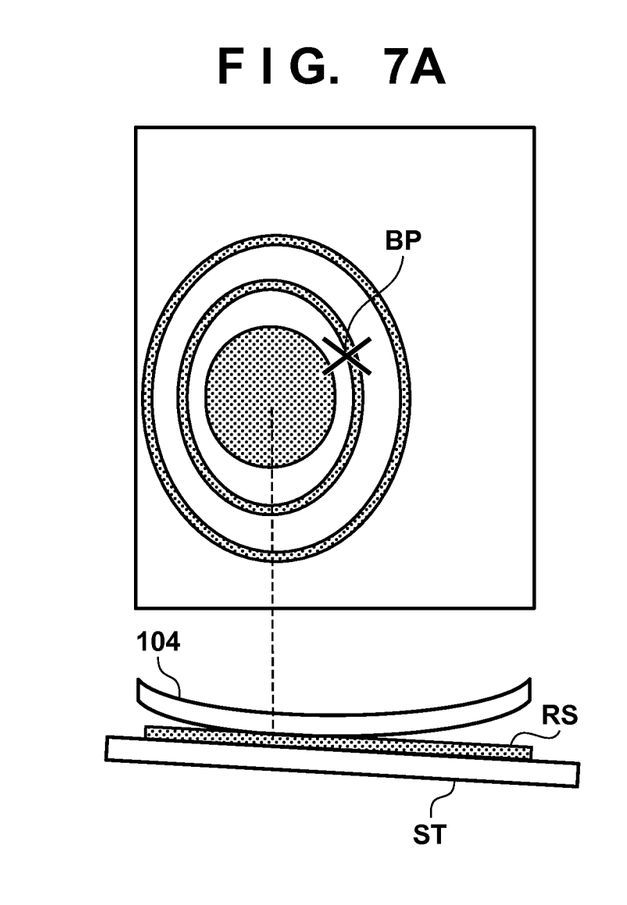
FIGS. 7A and 7B are views showing an interference pattern if each distance difference between interference fringes exceeds a threshold.
Figure 7B:
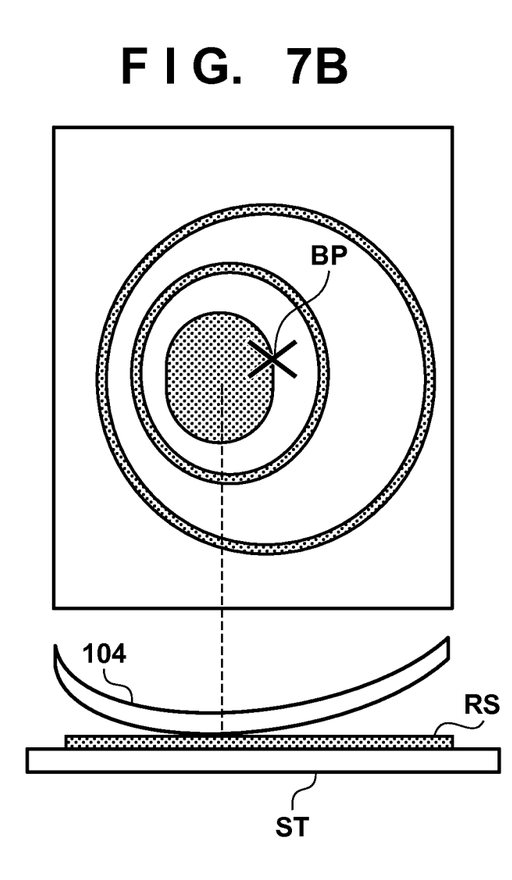

FIGS. 7A and 7B are views showing the interference pattern if each distance difference between the interference fringes exceeds the threshold. Each of FIGS. 7A and 7B shows the section of the mold 104, the substrate ST, and the resin RS from the side surfaces in the two directions perpendicular to each other, and the interference pattern detected by the detection unit 116 corresponding to that time.

In FIG. 7A, the interference fringes included in the interference pattern are not detected centered on the barycentric position BP of the shot region. Occurrence of a tilt difference between the mold 104, and the substrate ST and the substrate stage 102 when separating the mold 104 from the cured resin RS on the substrate by moving the mold 104 upward is considered as a factor in detecting such an interference pattern. Therefore, the control unit 120 corrects a tilt between the mold 104 and the substrate ST such that the mold 104 is normally separated from the cured resin RS on the substrate. As described above, the control unit 120 can correct the tilt between the mold 104 and the substrate ST based on the shift between the barycenter (center) of the interference pattern and the barycenter (reference position) of the shot region.

In FIG. 7B, each distance difference in the lateral direction between the interference fringes included in the interference pattern is large and exceeds the threshold. Nonuniform application of the resin RS onto the substrate or nonuniform application of the surfactant to the pattern surface 104a of the mold 104 is considered as the factor in detecting such an interference pattern.

If the interference pattern shown in each of FIGS. 7A and 7B is detected, clogging of the pattern of the mold 104 may occur or the pattern of the resin RS formed on the substrate may be damaged. Therefore, the control unit 120 evaluates that the mold 104 is not normally separated from the cured resin RS on the substrate, notifies that evaluation by an alarm or the like, and stops the imprint process for the next shot region on the substrate ST. Furthermore, the control unit 120 evaluates that application of the surfactant to the pattern surface 104a of the mold 104 is not enough, and causes the coating unit 119 to apply the surfactant to the pattern surface 104a of the mold 104. Note that the control unit 120 may change the moving velocity of the mold 104 without stopping the imprint process for the next shot region on the substrate ST even if it evaluates that the mold 104 is not normally separated from the cured resin RS on the substrate. More specifically, the control unit 120 makes the velocity of relatively moving the mold 104 and the substrate ST by the moving unit 110 to be lower than the moving velocity when the mold 104 is not separated normally.

Second Embodiment

A processing unit 118 may obtain, as information on a separation state between a mold 104 and a resin RS, a time (separation time) required to separate the mold 104 from the cured resin RS on the substrate. A detection unit 116 detects a plurality of interference patterns while separating the mold 104 from the cured resin RS on the substrate. Therefore, the processing unit 118 can specify time when a moving unit 110 starts to move the mold 104 upward as starting time and time when the detection unit 116 does not detect the interference pattern anymore as finishing time, and obtain a time between them as the separation time.

The processing unit 118 may specify the starting time and the finishing time of the separation time based on a boundary position EXF between a region where the mold 104 and the cured resin RS on the substrate are separated from each other, and a region where the resin RS and the mold 104 are not separated from each other. In this case, time when each of the left and right widths of the boundary position EXF becomes smaller than a predetermined width is determined as the finishing time of the separation time.

A control unit 120 evaluates that the mold 104 is not normally separated from the cured resin RS on the substrate if the separation time obtained by the processing unit 118 falls outside an allowable range. Then, as in the first embodiment, the control unit 120 notifies, by an alarm or the like, that the mold 104 is not normally separated from the cured resin RS on the substrate and stops an imprint process for the next shot region on a substrate ST. Furthermore, the control unit 120 evaluates that application of a surfactant to a pattern surface 104a of the mold 104 is not enough, and causes a coating unit 119 to apply the surfactant to the pattern surface 104a of the mold 104. Note that the control unit 120 may change the moving velocity of the mold 104 without stopping the imprint process for the next shot region on the substrate ST.

Third Embodiment

A processing unit 118 may obtain, as information on a separation state between a mold 104 and a resin RS, a force (release force) required when the mold 104 separates from the cured resin RS on the substrate. As described above, an interference pattern detected when the mold 104 separates from the cured resin RS on the substrate is generated by a gap formed between the mold 104 and a substrate ST upon deforming the mold 104. Therefore, the interval between interference fringes included in the interference pattern indicates, in addition to the amount of a change in the gap between the mold 104 and the substrate ST, the deformation amount of the mold 104.

The deformation amount of the mold 104 can be regarded as the release force required when the mold 104 separates from the cured resin RS on the substrate. As the deformation amount of the mold 104 increases, the release force also increases. Therefore, the processing unit 118 can estimate the deformation amount of the mold 104 and the release force required when the mold 104 separates from the cured resin RS on the substrate by obtaining the interval between the interference fringes included in the interference pattern.

Figure 8A:
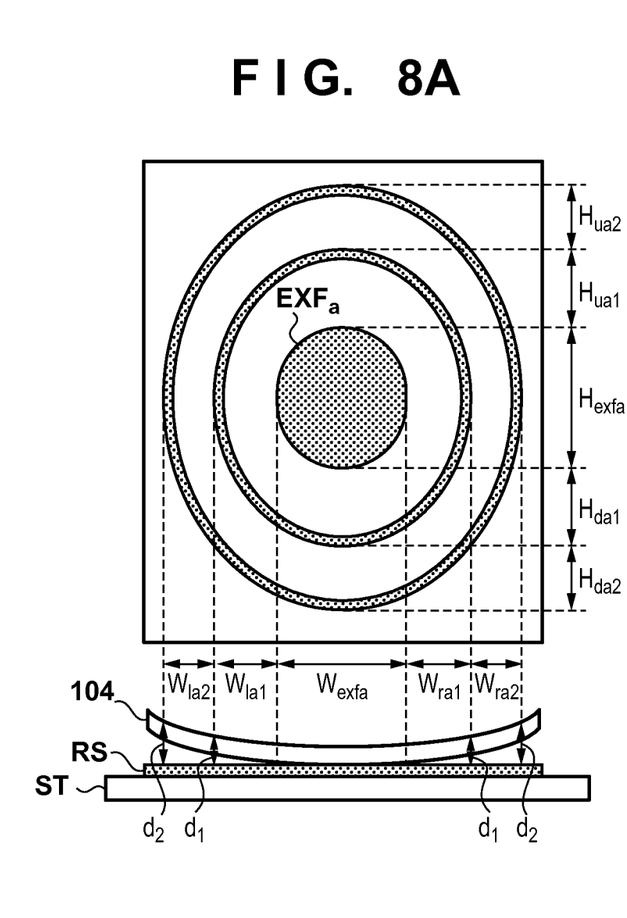
FIGS. 8A and 8B are views showing an interference pattern when separating a mold from a cured resin on a substrate.
Figure 8B:
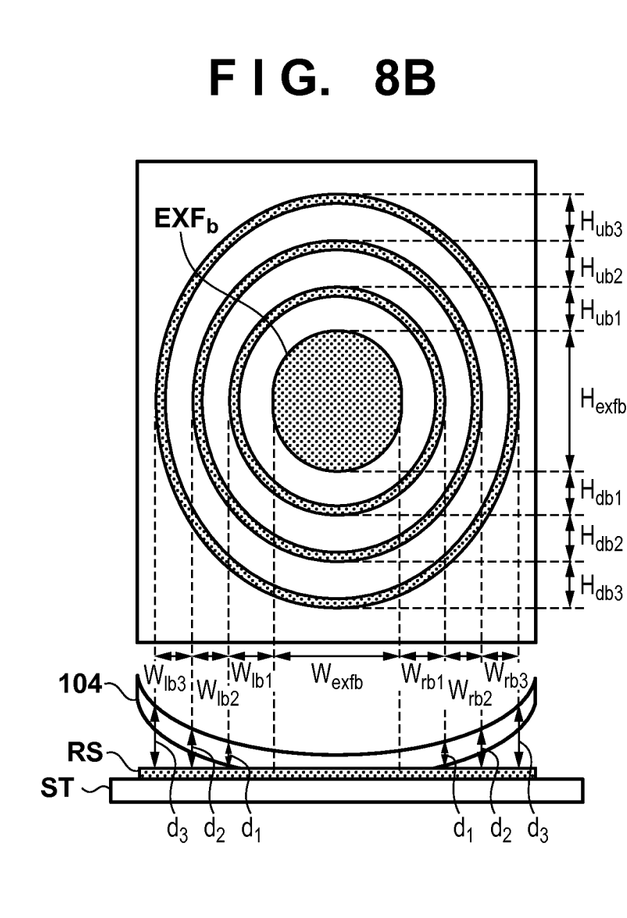

FIGS. 8A and 8B are views showing an interference pattern when separating the mold 104 from the cured resin RS on the substrate. Each of FIGS. 8A and 8B shows the section of the mold 104, the substrate ST, and the resin RS, and the interference pattern detected by a detection unit 116 at that time.

Referring to FIGS. 8A and 8B, boundary positions $EXF_a$ and $EXF_b$ between a region where the mold 104 and the cured resin RS on the substrate are separated from each other and a region where the resin RS and the mold 104 are not separated from each other are the same, and their upper, lower, left, and right widths are also the same. Therefore, $W_{exfa} = W_{exfb}$ and $H_{exfa} = H_{exfb}$ hold. On the other hand, intervals ($W_{la1}$, $W_{ra1}$, $H_{ua1}$, $H_{da1}$) and ($W_{lb1}$, $W_{rb1}$, $H_{ub1}$, $H_{db1}$) from the respective boundary positions $EXF_a$ and $EXF_b$ to the corresponding first interference fringes differ. In addition, intervals ($W_{la2}$, $W_{ra2}$, $H_{ua2}$, $H_{da2}$) and ($W_{lb2}$, $W_{rb2}$, $H_{ub2}$, $H_{db2}$) from the first interference fringe to the second interference fringe also differ.

As compared with each interval between the interference fringes included in the interference pattern shown in FIG. 8A, each interval between the interference fringes included in the interference pattern shown in FIG. 8B is smaller, but gaps d1 and d2 between the mold 104 and the substrate ST corresponding to the first interference fringe and the second interference fringe are the same. Therefore, FIGS. 8A and 8B indicate that the deformation amount of the mold 104 in FIG. 8A is larger than that in FIG. 8B. FIGS. 8A and 8B also indicate that the release force between the mold 104 and the resin RS in FIG. 8A is larger than that in FIG. 8B.

However, the deformation amount of the mold 104 and the release force when separating the mold 104 from the cured resin RS on the substrate can be obtained not by the intervals between the interference fringes included in the interference pattern but by the number of interference fringes for the same separation position.

A control unit 120 evaluates that the mold 104 is not normally separated from the cured resin RS on the substrate if the deformation amount of the mold 104 and the release force obtained by the processing unit 118 fall outside an allowable range. Then, as in the first and second embodiments, the control unit 120 notifies, by an alarm or the like, that the mold 104 is not normally separated from the cured resin RS on the substrate and stops an imprint process for the next shot region on the substrate ST. Furthermore, the control unit 120 evaluates that application of a surfactant to a pattern surface 104a of the mold 104 is not enough, and causes a coating unit 119 to apply the surfactant to the pattern surface 104a of the mold 104. Note that the control unit 120 may change the moving velocity of the mold 104 without stopping the imprint process for the next shot region on the substrate ST. As described above, the control unit 120 can correct, based on the intervals between the interference fringes included in the interference pattern, a velocity when separating the mold 104 from the cured resin RS on the substrate.

Fourth Embodiment

In the first to third embodiments, the processing unit 118 obtains information on the separation state between the mold 104 and the resin RS based on the interference pattern detected by the detection unit 116. However, a processing unit 118 may obtain information on the separation state between a mold 104 and a resin RS by comparing an interference pattern detected by a detection unit 116 with a reference interference pattern. The reference interference pattern is obtained when, for example, the mold 104 is normally separated from the cured resin RS on the substrate. The reference interference pattern may also be detected by the detection unit 116 in an imprint process so far.

Comparison between the reference interference pattern and the interference pattern detected by the detection unit 116 is made by comparing, for example, distances from the barycentric position of a shot region on a substrate ST to the respective interference fringes of the interference pattern. Alternatively, comparison may be made between times required to separate the mold 104 from the cured resin RS on the substrate, or between the deformation amount of the mold 104 and a release force. Like template matching in image processing, the shape of the interference pattern detected by the detection unit 116 may be compared with the shape of the reference interference pattern.

Fifth Embodiment

In the first to fourth embodiments, the processing unit 118 obtains one piece of information (the deformation amount of the mold 104, the separation time, the separation position, the release force, or the like) as information on the separation state between the mold 104 and the resin RS. However, a processing unit 118 may obtain all pieces of information or some pieces of information out of the all pieces of information. In this case, a control unit 120 evaluates, with respect to a plurality of pieces of information on a separation state between a mold 104 and a resin RS obtained by the processing unit 118, whether the mold 104 is normally separated from the cured resin RS on the substrate. Then, the control unit 120 stops an imprint process for the next shot region on a substrate ST if it evaluates, with respect to even one piece out of the plurality of pieces of information, that the mold 104 is not separated normally. At this time, the control unit 120 may notify, by an alarm or the like, that the mold 104 is not normally separated from the cured resin RS on the substrate. Furthermore, the control unit 120 evaluates that application of a surfactant to a pattern surface 104a of the mold 104 is not enough, and causes a coating unit 119 to apply the surfactant to a pattern surface 104a of the mold 104. Note that the control unit 120 may change the moving velocity of the mold 104 without stopping the imprint process for the next shot region on the substrate ST.

In any of the first to fifth embodiments, an imprint apparatus 100 can obtain information on the separation state between the mold 104 and the resin RS based on the interference pattern detected by the detection unit 116. As described above, the imprint apparatus 100 is advantageous in evaluating the separation state between the mold 104 and the resin RS while separating the mold 104 from the cured resin RS on the substrate. Furthermore, the imprint apparatus 100 can suppress a decrease in the yield or the operating ratio of an article by controlling the imprint process based on the separation state evaluated as described above.

Sixth Embodiment

A method of manufacturing a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) by using an imprint apparatus 100. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-165198 filed on Aug. 14, 2014, which is hereby incorporated by reference herein in its entirety.

What is claimed is:

1. An imprint apparatus for forming a pattern in an imprint material on a substrate using a mold, the imprint apparatus comprising:

a light source configured to cure the imprint material;

an actuator configured to relatively move the mold and the substrate;

a detector configured to detect a pattern of light reflected by the mold and light reflected by the substrate and to detect a plurality of interference fringes included in the pattern; and a controller including a processor and a memory and being configured to control the imprint apparatus to obtain position information on the plurality of interference fringes, relative to a shot region where the pattern is formed on the substrate, detected by the detector while the mold is being separated from the cured imprint material by widening, using the actuator, an interval between the mold and the substrate and evaluate, based on the obtained position information on the plurality of interference fringes, a separation state of the mold and the cured imprint material on the substrate, wherein the controller is configured to control the imprint apparatus to (i) obtain, based on the obtained position information on the plurality of the interference fringes, at least one of a deformation amount of the mold and a release force required to separate the mold from the cured imprint material on the substrate based on an interval between the plurality of interference fringes and (ii) evaluate, based on the obtained at least one of the deformation amount of the mold and the release force required to separate the mold from the cured imprint material on the substrate, the separation state of the mold and the cured imprint material on the substrate.

2. The imprint apparatus according to claim 1, wherein the controller is configured to control the imprint apparatus to correct, based on a shift between a reference position of the substrate and the detected pattern, a tilt between the substrate and the mold according to the evaluated separation state of the mold and the cured imprint material on the substrate.

3. The imprint apparatus according to claim 1, wherein the controller is configured to control the imprint apparatus to correct, based on the plurality of interference fringes included in the detected pattern and the interval between the plurality of interference fringes, a velocity when separating the mold from the cured imprint material on the substrate according to the evaluated separation state of the mold and the cured imprint material on the substrate.

4. The imprint apparatus according to claim 1, wherein the controller is configured to control the imprint apparatus to stop an imprint process of forming the pattern for a next shot region on the substrate according to the evaluated separation state of the mold and the cured imprint material on the substrate.

5. The imprint apparatus according to claim 4, wherein the controller is configured to control the imprint apparatus to apply a surfactant to a pattern surface of the mold according to the evaluated separation state of the mold and the cured imprint material on the substrate.

6. The imprint apparatus according to claim 1, wherein in an imprint process of forming the pattern for the next shot region on the substrate, the controller is configured to control the imprint apparatus to lower a moving velocity when relatively moving the mold and the substrate by the actuator according to the evaluated separation state of the mold and the cured imprint material on the substrate.

7. The imprint apparatus according to claim 1, wherein the controller is configured to control the imprint apparatus to obtain a tilt between the mold and the substrate while causing the mold to be separated from the cured imprint material on the substrate based on the interval between the plurality of interference fringes.

8. The imprint apparatus according to claim 1, wherein the controller is configured to control the imprint apparatus to evaluate, based on the interval between the plurality of interference fringes, whether a surfactant is uniformly applied to a pattern surface of the mold.

9. An imprint apparatus for forming a pattern in an imprint material on a substrate using a mold, the imprint apparatus comprising:

a light source configured to cure the imprint material;

an actuator configured to relatively move the mold and the substrate;

a detector configured to detect a pattern of light reflected by the mold and light reflected by the substrate and to detect a plurality of interference fringes included in the pattern; and a controller including a processor and a memory and being configured to control the imprint apparatus to obtain information on the plurality of interference fringes detected by the detector while the mold is being separated from the cured imprint material by widening, using the actuator, an interval between the mold and the substrate and evaluate, based on the obtained information on the plurality of interference fringes, a separation state of the mold and the cured imprint material on the substrate, wherein the controller is configured to control the imprint apparatus to evaluate the separation state based on whether the plurality of interference fringes are detected symmetrically from a barycentric position of a shot region where the pattern is formed on the substrate.

10. An imprint apparatus for forming a pattern in an imprint material on a substrate using a mold, the imprint apparatus comprising:

a light source configured to cure the imprint material;

an actuator configured to relatively move the mold and the substrate;

a detector configured to detect a pattern of light reflected by the mold and light reflected by the substrate and to detect a plurality of interference fringes included in the pattern; and a controller including a processor and a memory and being configured to control the imprint apparatus to obtain information on the plurality of interference fringes detected by the detector while the mold is being separated from the cured imprint material by widening, using the actuator, an interval between the mold and the substrate and evaluate, based on the obtained information on the plurality of interference fringes, a separation state of the mold and the cured imprint material on the substrate, wherein the controller is configured to control the imprint apparatus to evaluate the separation state based on distance differences in a lateral direction between left and right end points of each of the plurality of interference fringes from a barycentric position of a shot region where the pattern is formed on the substrate.

11. An imprint apparatus for forming a pattern in an imprint material on a substrate using a mold, the imprint apparatus comprising:

a light source configured to cure the imprint material;

an actuator configured to relatively move the mold and the substrate;

a detector configured to detect a pattern of light reflected by the mold and light reflected by the substrate and to detect a plurality of interference fringes included in the pattern; and a controller including a processor and a memory and being configured to control the imprint apparatus to obtain information on the plurality of interference fringes detected by the detector while the mold is being separated from the cured imprint material by widening, using the actuator, an interval between the mold and the substrate and evaluate, based on the obtained information on the plurality of interference fringes, a separation state of the mold and the cured imprint material on the substrate, wherein the controller is configured to control the imprint apparatus to evaluate the separation state based on distance differences in a longitudinal direction between upper and lower end points of each of the plurality of interference fringes from a barycentric position of a shot region where the pattern is formed on the substrate.

* * * * *